United States Patent
Sawata

(10) Patent No.: US 11,402,346 B2
(45) Date of Patent: Aug. 2, 2022

(54) ELECTRICAL CONDUCTIVITY DETECTOR AND METHOD OF DETERMINING PHASE ADJUSTMENT VALUE OF BACKGROUND SUBTRACTION SIGNAL

(71) Applicant: SHIMADZU CORPORATION, Kyoto (JP)

(72) Inventor: Hideto Sawata, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 76 days.

(21) Appl. No.: 16/960,081

(22) PCT Filed: Feb. 9, 2018

(86) PCT No.: PCT/JP2018/004520
§ 371 (c)(1),
(2) Date: Jul. 4, 2020

(87) PCT Pub. No.: WO2019/155592
PCT Pub. Date: Aug. 15, 2019

(65) Prior Publication Data
US 2021/0055242 A1   Feb. 25, 2021

(51) Int. Cl.
*G01N 27/07* (2006.01)
*G01N 27/08* (2006.01)
*G01N 30/64* (2006.01)

(52) U.S. Cl.
CPC ............. *G01N 27/07* (2013.01); *G01N 27/08* (2013.01); *G01N 30/64* (2013.01)

(58) Field of Classification Search
CPC ........ G01N 27/02; G01N 27/07; G01N 27/08; G01N 27/22; G01N 30/64; G01N 30/60; H03G 3/30; H03G 1/0088

(Continued)

(56) References Cited

U.S. PATENT DOCUMENTS 4,227,151 A * 10/1980 Ellis .................. G01N 27/07
    324/448
4,672,322 A *  6/1987 Gratteau ............ G01N 27/07
    324/443

(Continued)

FOREIGN PATENT DOCUMENTS

CA   2906480 A1 *  9/2014  ............ G01N 27/02
EP   3594635 A1 *  1/2020  ............ G01F 1/58

(Continued)

OTHER PUBLICATIONS

Office Action for corresponding JP Application No. 2019-570234 dated Apr. 27, 2021, with English language machine translation.

(Continued)

*Primary Examiner* — Jermele M Hollington
*Assistant Examiner* — Sean Curtis
(74) *Attorney, Agent, or Firm* — Renner, Otto, Boisselle & Sklar, LLP

(57) ABSTRACT

An electrical conductivity detector includes a cell through which a liquid flows, a measurement part for obtaining an electrical conductivity signal which is a current corresponding to an electrical conductivity of the liquid flowing through the cell, a phase adjustment value holder that holds a phase adjustment value which is a predetermined shift amount between a phase of the electrical conductivity signal and a phase of a measurement voltage applied to the cell by the measurement part, a BG subtraction signal generator configured to generate a BG subtraction signal for removing a background component included in the electrical conductivity signal obtained by the measurement part, the BG subtraction signal being adjusted to have a phase substantially identical to the phase of the electrical conductivity signal using the phase adjustment value held in the phase adjustment value holder, an addition part configured to add the electrical conductivity signal and the BG subtraction (Continued)

signal with each other, and a calculation part configured to calculate the electrical conductivity of the liquid flowing through the cell using a signal output from the addition part.

3 Claims, 3 Drawing Sheets

(58) Field of Classification Search
USPC ............... 324/439; 73/1.02, 23.41, 61.55
See application file for complete search history.

(56) References Cited

U.S. PATENT DOCUMENTS

| | | | | |
|---|---|---|---|---|
| 5,008,627 | A * | 4/1991 | Tsutsuta | G01N 27/06 324/613 |
| 5,138,264 | A * | 8/1992 | Seki | G01N 27/06 324/439 |
| 5,504,430 | A * | 4/1996 | Andersson | G01N 30/64 324/439 |
| 7,696,762 | B2 * | 4/2010 | Quackenbush | G01N 27/023 324/696 |
| 9,835,573 | B2 * | 12/2017 | Herb | G01N 27/028 |
| 10,473,498 | B2 * | 11/2019 | Momose | G01F 1/60 |
| 11,022,587 | B2 * | 6/2021 | Sawata | H03G 3/30 |
| 2002/0137488 | A1 * | 9/2002 | Mitama | H04B 1/30 455/323 |
| 2010/0116016 | A1 * | 5/2010 | Bungo | G01N 30/62 73/1.02 |
| 2014/0320146 | A1 * | 10/2014 | Sakamoto | G01N 30/96 324/466 |
| 2015/0002178 | A1 * | 1/2015 | Herb | G01N 27/06 324/693 |
| 2015/0097588 | A1 * | 4/2015 | Kim | G01N 27/08 324/693 |
| 2017/0261357 | A1 * | 9/2017 | Wang | G01F 1/74 |
| 2019/0369066 | A1 * | 12/2019 | Sawata | G01N 30/64 |
| 2020/0209202 | A1 * | 7/2020 | Sawata | G01N 30/60 |
| 2020/0319147 | A1 * | 10/2020 | Sawata | G01N 30/86 |
| 2021/0055242 | A1 * | 2/2021 | Sawata | G01N 30/64 |

FOREIGN PATENT DOCUMENTS

| | | | | |
|---|---|---|---|---|
| EP | 2976650 | B1 * | 5/2021 | ............. G01N 27/02 |
| JP | 02179480 | A * | 7/1990 | ............. G01N 27/07 |
| JP | 1990179480 | A | 7/1990 | |
| JP | 1993-188029 | A | 7/1993 | |
| JP | H11-281687 | A | 10/1999 | |
| JP | 2000-046776 | A | 2/2000 | |
| RU | 2658539 | C1 * | 6/2018 | ............. G01N 27/02 |
| WO | WO-2012062798 | A1 * | 5/2012 | ............. G01N 27/06 |
| WO | WO-2013183870 | A1 * | 12/2013 | ............. G01N 27/046 |
| WO | WO-2014150785 | A2 * | 9/2014 | ............. G01N 27/02 |
| WO | WO-2014198428 | A1 * | 12/2014 | ......... G01N 21/6428 |
| WO | WO-2018150562 | A1 * | 8/2018 | ............. G01N 30/02 |
| WO | WO-2019155592 | A1 * | 8/2019 | ............. G01N 27/07 |

OTHER PUBLICATIONS

International Search Report for corresponding Application No. PCT/JP2018/004520, dated May 1, 2018.
Written Opinion for corresponding Application No. PCT/JP2018/004520, dated May 1, 2018.
Office Action for corresponding CN Application No. 201880079160.6 dated Dec. 3, 2021, with English language machine translation.

* cited by examiner

ELECTRICAL CONDUCTIVITY DETECTOR AND METHOD OF DETERMINING PHASE ADJUSTMENT VALUE OF BACKGROUND SUBTRACTION SIGNAL

TECHNICAL FIELD

The present invention relates to an electrical conductivity detector used for detecting a sample component in ion chromatography, for example, and a method of obtaining a phase adjustment value of a background subtraction signal of the electrical conductivity detector.

BACKGROUND ART

An electrical conductivity detector (also referred to as a conductivity meter or a conductivity sensor) immerses a pair of electrodes in a liquid flowing through a cell, applies a voltage between the electrodes, and detects a change in magnitude of a current flowing between the electrodes as a change in electrical conductivity in the cell.

The electrical conductivity detector generally amplifies an electrical conductivity signal based on a value of a current flowing between electrodes by an amplifier circuit, and determines an electrical conductivity using the amplified signal (for example, see Patent Document 1). The higher a degree of amplification (gain) by the amplifier circuit is, the higher the detection sensitivity can be. However, the degree of amplification by the amplifier circuit needs to be adjusted not to exceed a dynamic range of a signal processing circuit. Thus, the larger the electrical conductivity signal before amplification, the lower the degree of amplification. The detection sensitivity therefore needs to be lower.

Here, the electrical conductivity signal includes a background signal (hereinafter, referred to as a BG signal) based on the electrical conductivity of a mobile phase in addition to a signal based on the electrical conductivity of a sample to be measured. Thus, by subtracting the BG signal based on the electrical conductivity of the mobile phase from the electrical conductivity signal to decrease the signal to be amplified by the amplifier circuit, the electrical conductivity of each sample can be measured with high sensitivity without saturation.

PRIOR ART DOCUMENT

Patent Document

Patent Document 1: Japanese Patent Laid-open Publication No. H11-281687

SUMMARY OF THE INVENTION

Problems to be Solved by the Invention

In general, the subtraction of the BG signal from the electrical conductivity signal is performed by adding a background subtraction signal (hereinafter, a BG subtraction signal) to the electrical conductivity signal in a summing amplifier. Assuming that a measured voltage applied between the electrodes to obtain the electrical conductivity signal is $V_0 \sin\theta$, the BG subtraction signal $B \sin\theta$ is generated based on the measurement voltage. On the other hand, since a phase of the electrical conductivity signal based on the value of the current flowing between the electrodes is shifted from a phase of the measurement voltage, the electrical conductivity signal is $A \sin(\theta+\alpha)$ ($\alpha\neq 0$). An output signal S of the summing amplifier can thus be expressed by the following equation (1) where R is a gain constant of the summing amplifier.

$$S=(A \sin(\theta+\alpha)-B \sin\theta)\times R \quad (1)$$

Amplitude B of the BG subtraction signal is adjusted to be identical to amplitude A of the electrical conductivity signal when only the mobile phase flows in the cell. The above equation (1) can thus be expressed by the following equation (2).

$$S=(A \sin(\theta+\alpha)-A \sin\theta)\times R \quad (2)$$

Since there is a phase difference $\alpha$ between the phase $\theta+\alpha$ of the electrical conductivity signal and the phase $\theta$ of the BG subtraction signal, the output signal S of the summing amplifier does not become 0 even when only the mobile phase is flowing through the cell. The output signal S increases as the phase difference $\alpha$ between the electrical conductivity signal and as the BG subtraction signal increases and as the value of the gain constant R increases. In recent years, high-sensitivity detection of electrical conductivity has been demanded, and the gain constant R needs to be as large as possible. Thus, minimizing the phase difference $\alpha$ between the electrical conductivity signal and the BG subtraction signal to make a background component included in the electrical conductivity signal close to 0 is required.

The present invention has been made in view of the above problems, and an object of the present invention is to increase efficiency of removing a background component included in an electrical conductivity signal of an electrical conductivity detector.

Solutions to the Problems

An electrical conductivity detector according to the present invention includes a cell through which a liquid flows, a measurement part for obtaining an electrical conductivity signal which is a current corresponding to an electrical conductivity of the liquid flowing through the cell, a phase adjustment value holder that holds a phase adjustment value which is a predetermined shift amount between a phase of the electrical conductivity signal and a phase of a measurement voltage applied to the cell by the measurement part, a BG subtraction signal generator configured to generate a BG subtraction signal for removing a background component included by the electrical conductivity signal obtained by the measurement part, the BG subtraction signal being adjusted to have a phase substantially identical to the phase of the electrical conductivity signal using the phase adjustment value held in the phase adjustment value holder, an addition part configured to add the electrical conductivity signal and the BG subtraction signal with each other, and a calculation part configured to calculate the electrical conductivity of the liquid flowing through the cell using a signal output from the addition part. The phase adjustment value held in the phase adjustment value holder is determined by a method to be described later.

A method according to the present invention is a method of determining a phase adjustment value for making a phase of a BG subtraction signal of an electrical conductivity detector to be substantially identical to a phase of an electrical conductivity signal. The electrical conductivity detector includes a cell through which a liquid flows, a measurement part for obtaining the electrical conductivity signal which is a current corresponding to an electrical conductivity of the liquid flowing through the cell, a BG subtraction signal generator that generates a BG subtraction signal for removing a background component included in the electrical conductivity signal obtained by the measurement part, an addition part configured to add the electrical conductivity signal and the BG subtraction signal with each other, and a calculation part configured to calculate the electrical conductivity of the liquid flowing through the internal channel of the measurement cell using a signal output from the addition part. The method includes a search step of changing the phase of the BG subtraction signal by a minute interval using as a standard a phase of a measurement voltage applied to the cell by the measurement part, obtaining a signal at each phase by adding the electrical conductivity signal and the background subtraction signal every time when the phase of the background subtraction signal is changed, calculating an integrated value for one cycle of the signal at each phase, and searching the phase of the BG subtraction signal when the integrated value is minimized, and a phase adjustment value determination step of determining the phase adjustment value which is a difference between the phase of the BG subtraction signal and the phase of the measurement voltage at the time when the integrated value is minimized.

It is known that the phase of the current flowing between the electrodes for measuring the electrical conductivity of the liquid flowing through the cell is advanced ahead of the phase of the measurement voltage. Assuming that the phase of the measurement voltage is $\theta$, the phase of the electrical conductivity signal is $\theta+\alpha$. As a result, a phase $\beta$ of the BG subtraction signal is advanced by a minute interval $\gamma$ based on a phase $\theta$ of the measurement voltage such that $\beta=\theta$, $\theta+\gamma$, $\theta+2\gamma$, $\theta+3\gamma$, and the like, and thus the phase $\beta$ of the BG subtraction signal can be reliably close to a phase $\theta+\alpha$ of the electrical conductivity signal.

In the method of the present invention, preferably, in the search step, the phase of the BG subtraction signal is advanced by the minute interval, and the phase immediately before the integrated value for one cycle of the signal at each phase obtained by adding the electrical conductivity signal and the BG subtraction signal starts to increase is searched. The phase of the BG subtraction signal immediately before the integrated value for one cycle of the signal obtained by adding the electrical conductivity signal and the BG subtraction signal starts to increase is the phase closest to the phase of the electrical conductivity signal. Thus, in the phase adjustment value determination step, the difference between the phase of the BG subtraction signal immediately before the integrated value starts to increase and the phase of the measurement voltage can be obtained as the phase adjustment value.

Effects of the Invention

In the electrical conductivity detector according to the present invention, the BG subtraction signal generator for generating the BG subtraction signal is configured to generate the BG subtraction signal adjusted to have a phase substantially identical to the electrical conductivity signal using the phase adjustment value held in the phase adjustment value holder. Thus, there is almost no phase difference between the electrical conductivity signal and the BG subtraction signal, and the background component included in the electrical conductivity signal can be close to 0.

In the method according to the present invention, the phase of the BG subtraction signal is changed by the minute interval using as a standard the phase of the measurement voltage, the integrated value for one cycle of the signal obtained by adding the electrical conductivity signal and the BG subtraction signal at each phase is calculated, the phase of the BG subtraction signal when the integrated value is minimized is searched, and the difference between the phase of the BG subtraction signal when the integrated value is minimized and the phase of the measurement voltage is determined as the phase adjustment value. As a result, the phase adjustment value for making the phase of the BG subtraction signal close to the phase of the electrical conductivity signal can be obtained accurately.

EMBODIMENT OF THE INVENTION

Figure 1:
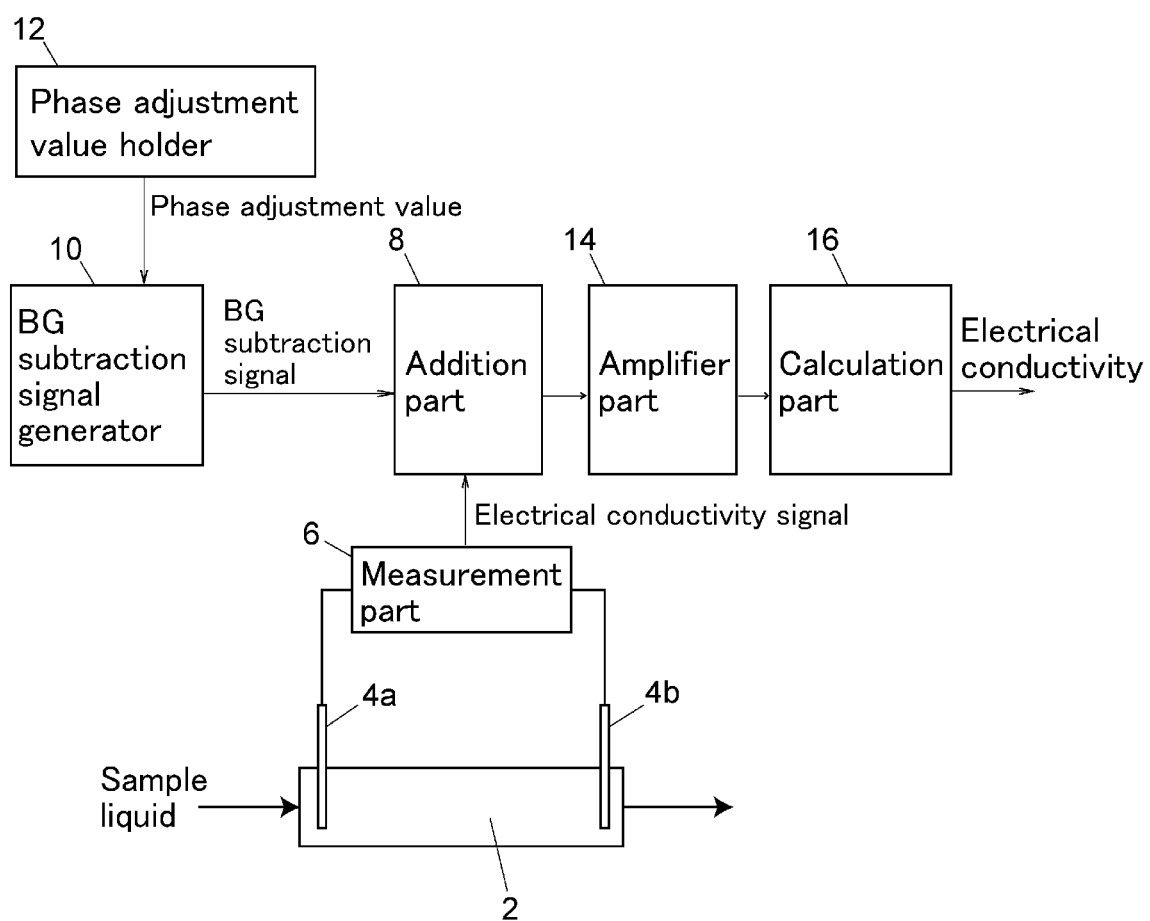
FIG. 1 is a configuration diagram schematically showing an embodiment of an electrical conductivity detector.

Hereinafter, an embodiment of an electrical conductivity detector according to the present invention and a method of obtaining a phase adjustment value used for the electrical conductivity detector will be described with reference to the drawings.

First, a configuration of an embodiment of the electrical conductivity detector will be described with reference to FIG. 1.

The electrical conductivity detector includes a cell 2, a measurement part 6, an addition part 8, a BG subtraction signal generator 10, a phase adjustment value holder 12, an amplifier part 14, and a calculation part 16.

A sample liquid flows through the cell 2. The measurement part 6 is for obtaining a current based on an electrical conductivity of the liquid flowing through the cell 2 as an electrical conductivity signal. The measurement part 6 applies a measurement voltage between a pair of electrodes 4a and 4b immersed in the liquid flowing through the cell 2, and detects a change in a value of the current flowing between the electrodes 4a and 4b as a change in the electrical conductivity of the liquid flowing through the cell 2.

The BG subtraction signal generator 10 is configured to generate a BG subtraction signal for removing, from the electrical conductivity signal, a BG signal included in the electrical conductivity signal obtained by the measurement part 6. The BG subtraction signal generated by the BG subtraction signal generator 10 is added to the electrical conductivity signal from the measurement part 6 in the addition part 8.

A signal obtained by adding the BG subtraction signal to the electrical conductivity signal with each other is amplified at a predetermined amplification rate in the amplifier part 14 and input to the calculation part 16. The calculation part 16 is configured to determine the electrical conductivity of the liquid flowing through the cell 2 based on the signal amplified by the amplifier part 14.

The phase adjustment value holder 12 holds a phase adjustment value for adjusting a phase of the BG subtraction signal. The phase adjustment value is a predetermined value. A method of obtaining the phase adjustment value will be described later. The BG subtraction signal generator 10 is configured to generate the BG subtraction signal having the phase substantially identical to a phase of the electrical conductivity signal from the measurement part 6 using the phase adjustment value held in the phase adjustment value holder 12. The BG subtraction signal generator 10 is a function provided by, for example, software executed on a computer. The phase adjustment value holder 12 is a function provided by a partial area of a storage device disposed in a computer.

A measurement principle of the electrical conductivity detector will be described with reference to FIG. 2.

The measurement part 6 applies a measurement voltage $V_0 \sin\theta$ between the electrodes 4a and 4b. The measurement part 6 detects the current flowing between the electrodes 4a and 4b as a signal (electrical conductivity signal) based on the electrical conductivity of the liquid in the cell 2. The phase of the electrical conductivity signal, which advances ahead of the phase of the measurement voltage, can be expressed by $A \sin(\theta+\alpha)$.

The BG subtraction signal generator 10 generates the BG subtraction signal $-B \sin(\theta+\alpha')$ obtained by advancing the phase of the signal $-B \sin\theta$ based on the measurement voltage $V_0 \sin\theta$ by the phase adjustment value $\alpha'$ held in the phase adjustment value holder 12. The phase adjustment value $\alpha'$ is determined so that the phase of the BG subtraction signal is substantially identical to the phase of the electrical conductivity signal, and thus the phase adjustment value $\alpha'$ is expressed by $\alpha' \approx \alpha$. Amplitude B of the BG subtraction signal is adjusted by, for example, a bifurcation method so as to be substantially identical to amplitude $A_0$ of the electrical conductivity signal when only a mobile phase flows through the cell 2.

Figure 2:
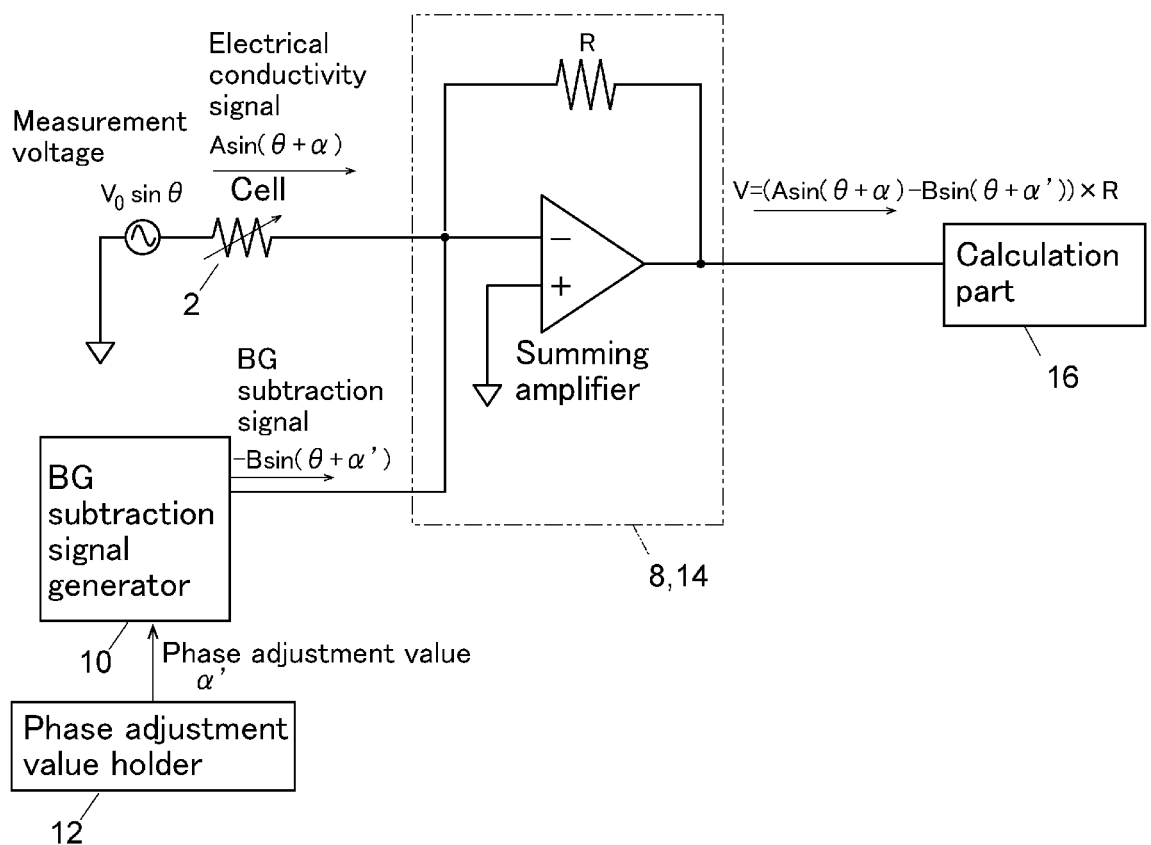
FIG. 2 is a principle diagram for describing a principle of electrical conductivity measurement according to the embodiment.

In FIG. 2, the addition part 8 and the amplifier part 14 in FIG. 1 are provided by a summing amplifier. The electrical conductivity signal $A \sin(\theta+\alpha)$ obtained by the measurement part 6 and the BG subtraction signal $-B \sin(\theta+\alpha')$ generated by the BG subtraction signal generator 10 are added in the summing amplifiers 8 and 14, and are amplified with a predetermined gain coefficient R. An output signal V from the summing amplifiers 8 and 14 is expressed by $$V=(A \sin(\theta+\alpha)-B \sin(\theta+\alpha'))\times R.$$

The calculation part 16 determines the electrical conductivity of the sample liquid flowing through the cell 2 using the output signal V.

Here, since the amplitude $A_0$ of the electrical conductivity signal when only the mobile phase flows through the cell 2 and the amplitude B of the BG subtraction signal are adjusted to be substantially identical, the output signal $V_0$ from the summing amplifiers 8 and 14 when only the mobile phase flows through the cell 2 is expressed by $$V_0=(A_0 \sin(\theta+\alpha)-B \sin(\theta+\alpha'))\times R \approx 0.$$

Figure 3:
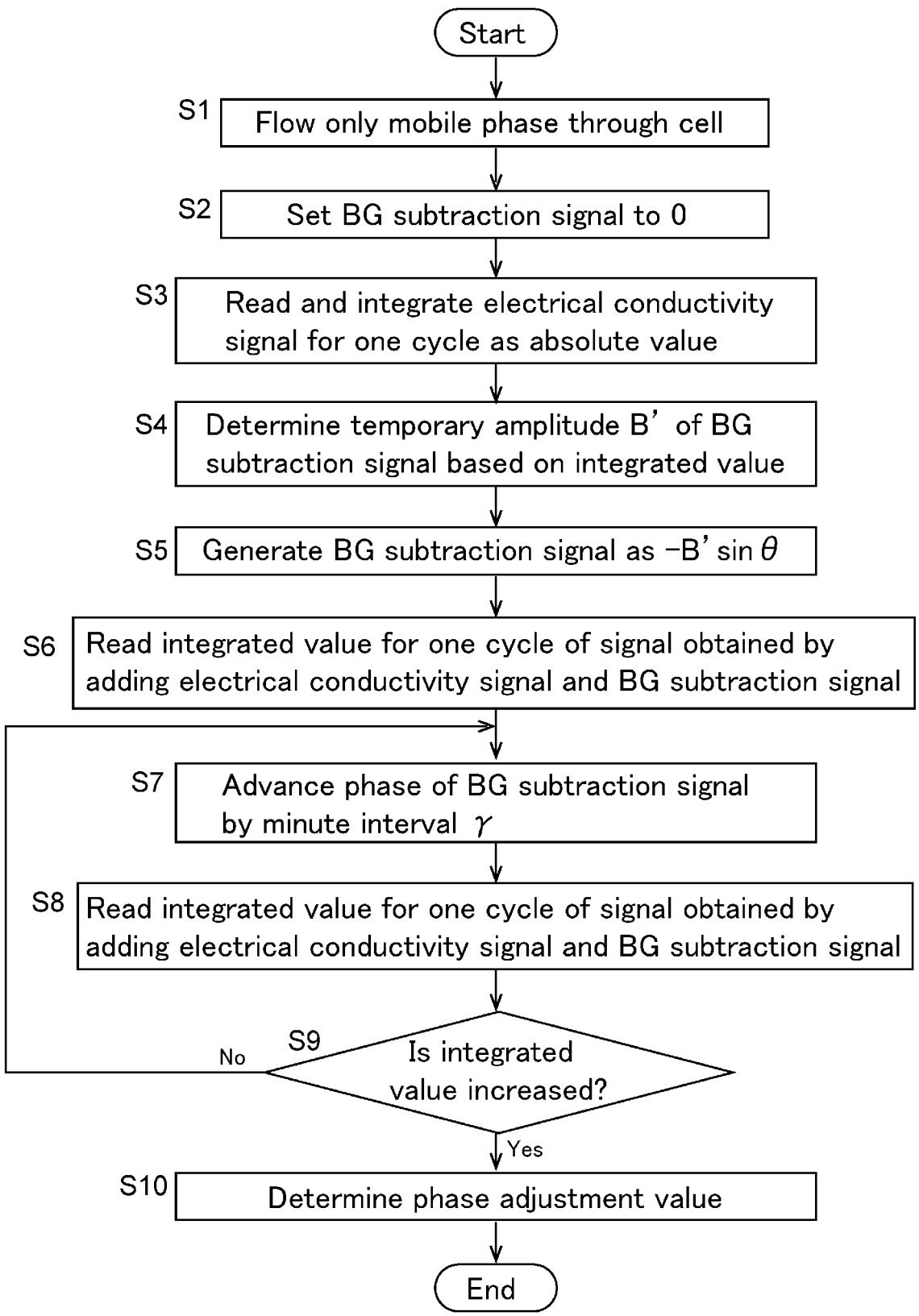
FIG. 3 is a flowchart showing an example of a method of obtaining a phase difference adjustment value.

Next, the method of obtaining the phase adjustment value $\alpha'$ will be described with reference to a flowchart of FIG. 3 together with FIG. 2.

First, only the mobile phase flows through the cell 2 (step S1), and the BG subtraction signal is set to 0 (step S2). As a result, an electrical conductivity signal based on only the electrical conductivity of the mobile phase corresponding to a background signal is input to the summing amplifiers 8 and 14. The absolute value for one cycle of the electrical conductivity signal is read and integrated by the calculation part 16 (step S3). A temporary amplitude B' of the BG subtraction signal is obtained based on the integrated value (step S4). The temporary amplitude B' of the BG subtraction signal does not need to be obtained based on the integrated value obtained in steps S1 to S3. However, a signal obtained by amplifying an added signal of the electrical conductivity signal and the BG subtraction signal needs to prevented from being saturated in a search step for a phase adjustment value $\alpha'$ to be described later. It is therefore preferable to set the temporary amplitude B' to a value close to the amplitude $A_0$ of the electrical conductivity signal when only the mobile phase flows through the cell 2.

Next, the BG subtraction signal generator 10 generates a BG subtraction signal $-B' \sin\theta$ (step S5). Thus, the output signal V from the summing amplifiers 8 and 14 is expressed by $$V=(A_0 \sin(\theta+\alpha)-B' \sin(\theta))\times R.$$

The calculation part 16 reads the integrated value of the signal V for one cycle (step S6).

The BG subtraction signal generator 10 generates a BG subtraction signal $-B' \sin(\theta+\gamma)$ whose phase has advanced by a minute interval $\gamma$ ($\gamma>0$) (step S7). Thus, the output signal V from the summing amplifiers 8 and 14 is expressed by $$V=(A_0 \sin(\theta+\alpha)-B' \sin(\theta+\gamma))\times R.$$

The integrated value of the signal V for one cycle is read by the calculation part 16 (step S8), and the integrated value of the output signal V before the phase of the BG subtraction signal is advanced and the output signal V after the phase of the BG subtraction signal is advanced are compared (step S9).

The steps S7 to S9 are repeatedly executed until the integrated value of the signal V starts to increase. As described above, the magnitude of the signal obtained by adding the electrical conductivity signal and the BG subtraction signal increases as a phase difference between the electrical conductivity signal and the BG subtraction signal increases. The magnitude of the signal obtained by adding the electrical conductivity signal and the BG subtraction signal decreases as the phase difference between the electrical conductivity signal and the BG subtraction signal decreases. Thus, when the phase of the BG subtraction signal is advanced by the minute interval $\gamma$, the integrated value of the signal V continues to decrease until the phase difference between the electrical conductivity signal and the BG subtraction signal is minimized, and thereafter starts to increase. As a result, the phase obtained by returning by $\gamma$ the phase of the BG subtraction signal when the integrated value of the signal V starts to increase is the phase closest to the phase of the electrical conductivity signal. The phase adjustment value $\alpha'$ is determined based on the phase at that time (step S10).

Assuming that the integrated value of the signal V starts to increase when the phase of the BG subtraction signal is advanced n times by $\gamma$, the BG subtraction signal having the phase closest to the phase of the electrical conductivity signal is expressed by $$-B' \sin(\theta+(n-1)\gamma).$$

Thus, the phase adjustment value $\alpha'$ is expressed by $$\alpha'=(n-1)\gamma.$$

Once the phase adjustment value $\alpha'$ is determined, the amplitude B of the BG subtraction signal can be accurately determined by the bifurcation method or the like.

DESCRIPTION OF REFERENCE SIGNS

2: Cell
4a, 4b: Electrode
6: Measurement part
8: Addition part 10: BG subtraction signal generator
12: Phase adjustment value holder
14: Amplifier part
16: Calculation part

The invention claimed is:

1. A method of determining a phase adjustment value for reducing a difference of a phase of a background subtraction signal of an electrical conductivity detector with respect to a phase of an electrical conductivity signal, wherein the electrical conductivity detector includes a cell through which a liquid flows, a measurement part for obtaining the electrical conductivity signal which is a current corresponding to the electrical conductivity of the liquid flowing through the cell, a BG subtraction signal generator that generates the background subtraction signal for removing a background component included in the electrical conductivity signal obtained by the measurement part, an addition part configured to add the electrical conductivity signal and the background subtraction signal with each other, and a calculation part configured to calculate the electrical conductivity of the liquid flowing through the internal channel of the measurement cell using a signal output from the addition part, the method comprising: a search step of changing the phase of the background subtraction signal by a minute interval using as a standard a phase of a measurement voltage applied to the cell in the measurement part, obtaining a signal at each phase by adding the electrical conductivity signal and the background subtraction signal every time when the phase of the background subtraction signal is changed, calculating an integrated value for one cycle of the signal at each phase, and searching the phase of the background subtraction signal when the integrated value is minimized; and a phase adjustment value determination step of determining the phase adjustment value which is a difference between the phase of the background subtraction signal and the phase of the measurement voltage at the time when the integrated value is minimized.

2. The method according to claim 1, wherein in the search step, the phase of the background subtraction signal is advanced by the minute interval, and a phase immediately before the integrated value for one cycle of the signal at each phase obtained by adding the electrical conductivity signal and the background subtraction signal starts to increase is searched, and in the phase adjustment value determination step, a difference between the phase of the background subtraction signal and the phase of the measurement voltage immediately before the integrated value starts to increase is determined as the phase adjustment value.

3. An electrical conductivity detector comprising: a cell through which a liquid flows; a measurement part for obtaining an electrical conductivity signal which is a current corresponding to an electrical conductivity of the liquid flowing through the cell; a phase adjustment value holder that holds a phase adjustment value which is determined by the method according to claim 1, the phase adjustment value being a predetermined shift amount between a phase of the electrical conductivity signal and a phase of a measurement voltage applied to the cell by the measurement part; a BG subtraction signal generator configured to generate a background subtraction signal for removing a background component included in the electrical conductivity signal obtained by the measurement part, the background subtraction signal being adjusted to have a phase substantially same as the phase of the electrical conductivity signal using the phase adjustment value held in the phase adjustment value holder; an addition part configured to add the electrical conductivity signal and the background subtraction signal with each other; and a calculation part configured to calculate the electrical conductivity of the liquid flowing through the cell using a signal output from the addition part.

* * * * *